(12) United States Patent
Sheperek et al.

(10) Patent No.: US 12,423,013 B2
(45) Date of Patent: *Sep. 23, 2025

(54) OPEN BLOCK FAMILY DURATION LIMITED BY TEMPERATURE VARIATION

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 159 days.

This patent is subject to a terminal disclaimer.

(21) Appl. No.: 18/490,040

(22) Filed: Oct. 19, 2023

(65) Prior Publication Data
US 2024/0045605 A1 Feb. 8, 2024

Related U.S. Application Data

(63) Continuation of application No. 16/947,820, filed on Aug. 19, 2020, now Pat. No. 11,842,061.

(51) Int. Cl.
*G06F 3/06* (2006.01)
*G01K 1/02* (2021.01)
(Continued)

(52) U.S. Cl.
CPC .............. *G06F 3/064* (2013.01); *G01K 1/026* (2013.01); *G01K 3/005* (2013.01); *G01K 3/04* (2013.01);
(Continued)

(58) Field of Classification Search
CPC ...... G06F 3/0679; G06F 3/0604; G06F 3/064; G06F 11/1004; G06F 3/061;
(Continued)

(56) References Cited

U.S. PATENT DOCUMENTS 9,464,999 B2 * 10/2016 Parthasarathy .......... G01K 1/00
9,799,387 B1 * 10/2017 Toh ..................... G11C 11/1675
(Continued)

*Primary Examiner* — Jared I Rutz
*Assistant Examiner* — Edward Waddy, Jr.
(74) *Attorney, Agent, or Firm* — Lowenstein Sandler LLP

(57) ABSTRACT

A system includes a memory device and a processing device, operatively coupled to the memory device. In some embodiments, the processing device accesses a matrix of threshold voltage offset bins, where a first dimension of the matrix is temperature and a second dimension of the matrix is a temporal voltage shift (TVS) amount. The processing device measures a temperature value based on a reference temperature value for a block family. The processing device measures a TVS value of a voltage level within one or more memory cell of the block family. The processing device retrieves, from the matrix, a threshold voltage offset bin based on the reference temperature value and the TVS value and reads data from any page of the block family via application of a threshold voltage offset, specified by the threshold voltage offset bin, to a base read level voltage.

20 Claims, 10 Drawing Sheets

(51) Int. Cl.
  *G01K 3/00*     (2006.01)
  *G01K 3/04*     (2006.01)
  *G01K 7/02*     (2021.01)

(52) U.S. Cl.
  CPC ............ *G01K 7/02* (2013.01); *G06F 3/0604* (2013.01); *G06F 3/0659* (2013.01); *G06F 3/0679* (2013.01)

(58) Field of Classification Search
  CPC .... G06F 3/0619; G06F 3/0632; G06F 3/0634; G06F 3/0659; G01K 1/026; G01K 3/005; G01K 3/04; G01K 7/02
  USPC .................. 711/E12.007, 103, E12.008, 161
  See application file for complete search history.

(56)  References Cited

U.S. PATENT DOCUMENTS

| | | | |
|---|---|---|---|
| 9,977,075 B1* | 5/2018 | Connor | G01R 31/287 |
| 10,416,737 B2* | 9/2019 | Chandra | G06F 1/206 |
| 11,385,802 B2* | 7/2022 | Sharon | G11C 16/3431 |
| 2017/0192477 A1* | 7/2017 | Lefurgy | G06F 1/3296 |
| 2018/0293029 A1* | 10/2018 | Achtenberg | G11C 29/028 |
| 2020/0335157 A1* | 10/2020 | Park | G11C 7/04 |
| 2020/0356279 A1* | 11/2020 | Chen | G06F 3/0611 |
| 2020/0411110 A1* | 12/2020 | Getreuer | G11C 16/0483 |
| 2022/0011967 A1* | 1/2022 | Mekhanik | G11C 29/50 |

* cited by examiner

OPEN BLOCK FAMILY DURATION LIMITED BY TEMPERATURE VARIATION

RELATED APPLICATIONS

The present application is a continuation of U.S. patent application Ser. No. 16/947,820, filed Aug. 19, 2020, which is incorporated herein by this reference.

TECHNICAL FIELD

Embodiments of the disclosure are generally related to memory sub-systems, and more specifically, are related to open block family duration limited by temperature variation.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
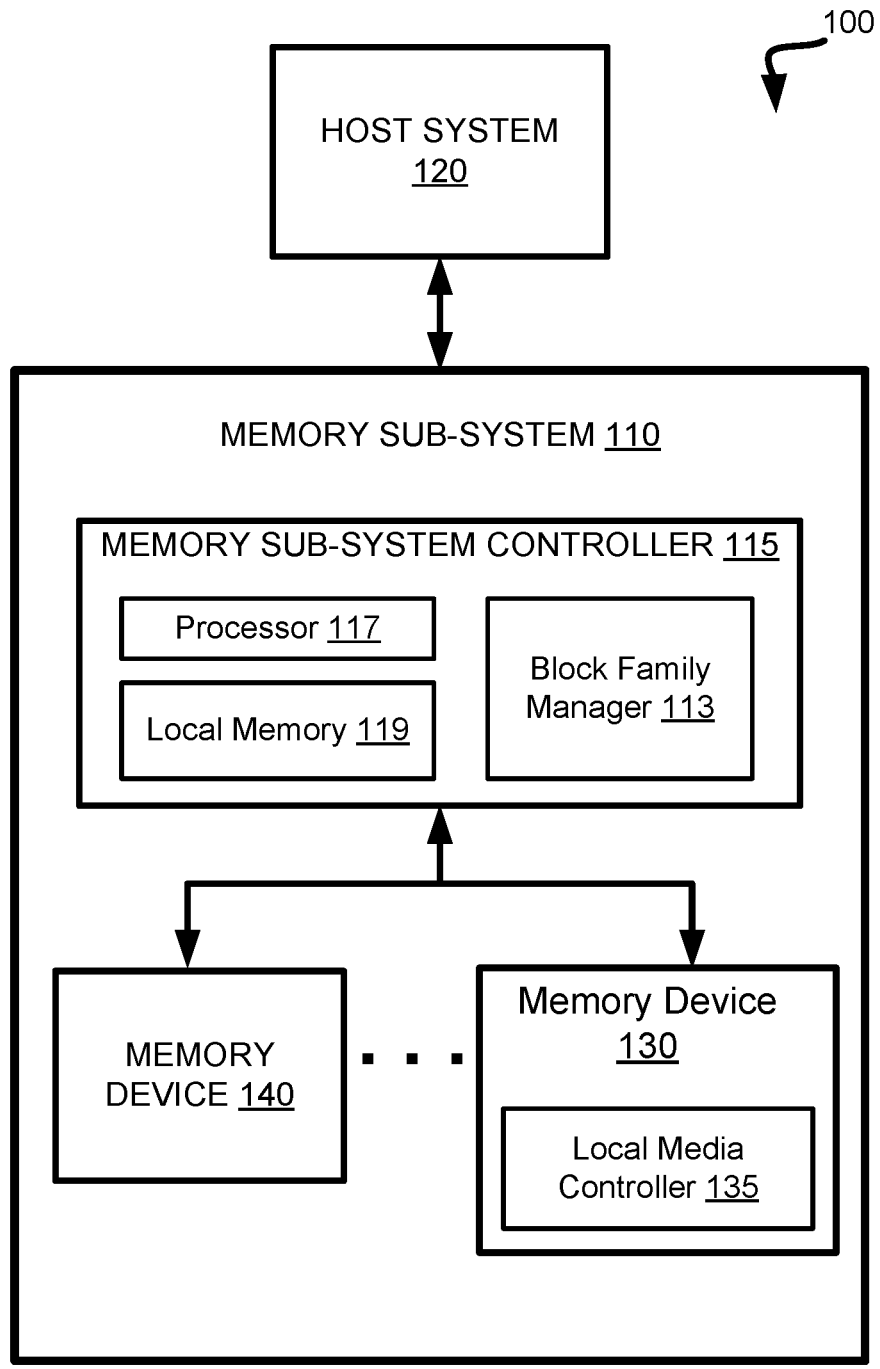
FIG. 1 illustrates an example computing system that includes a memory sub-system in accordance with some embodiments.

Embodiments of the present disclosure are directed to determining open block family duration limited by temperature variation. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. A "block" herein refers to of a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), block family information, and the like.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell degrades, which is referred to as "temporal voltage shift" (TVS), since the degrading electric charge causes the voltage distributions to shift along the voltage axis towards lower voltage levels. The threshold voltage is changing rapidly at first (immediately after the memory cell was programmed), and then slows down in an approximately logarithmic linear fashion with respect to the time elapsed since the cell programming event. Slow charge loss can also increase with increasing temperature of memory cells as well as with increasing program erase cycles, among other factors. For example, if over a week, a memory device remains close to 0° C., the slow charge loss can be around 20-50 millivolts (mV), while if the memory device is around 100° C., the slow charge loss can be around 400 mV, a significant difference. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

According to various embodiments, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly non-contiguous set of memory cells (which can reside in one or more full and/or partial blocks, the latter referred to as "partitions" herein) that have been programmed within a specified time window and temperature window, and thus are expected to exhibit similar or correlated changes in their respective data state metrics. A block family can be made with any granularity, containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, a block family experiences a specified temperature range using a temperature metric, which can change or be defined differently in different embodiments. In response to a value of the temperature metric meeting certain block family closing criteria, the block family can be closed. After closure of one block family, further programming to dice of the memory device is to a newly opened block family. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a value of a temperature metric exceeds a specified threshold temperature value. Because slow charge loss is impacted by temperature variation over time, temperature can be used for determining the duration of an open block family before the block family is closed. The temperature metric can be an average of an absolute temperature of the memory device over time, can be taken with reference to a single die (e.g., that has a maximum temperature across multiple dice when the block family is open), or can be an average of temperature across the multiple dice over a time period the block family is open. The specified threshold temperature value can also be adjusted over time, such as according to a function of an absolute temperature value for a particular reference temperature associated with the block family.

The memory sub-system controller can periodically perform a calibration process in order to associate each die of every block family with one of multiple predefined threshold voltage offset bins, which is in turn associated with the voltage offset to be applied for read operations. The associations of pages or blocks with block families and block families and dies with threshold voltage offset bins can be stored in respective metadata tables maintained by the memory sub-system controller.

Upon receiving a read command, the memory sub-system controller can identify the block family associated with the page or block identified by the logical block address (LBA) specified by the read command, identify the threshold voltage offset bin associated with the block family and die on which the page or block resides, compute the new threshold voltage by additively applying the threshold voltage offset associated with the threshold voltage offset bin to the base read level, and perform the read operation using the new threshold voltage. In some embodiments, the threshold voltage offset bin can be selected at least in part based on a reference temperature of blocks in the block family. The reference temperature can represent a temperature value of the memory cells of the block family as a whole.

Therefore, advantages of the systems and methods implemented in accordance with some embodiments of the present disclosure include, but are not limited to, improving the bit error rate in read operations by maintaining metadata tracking groups of memory cells (as block families) that are presumed to exhibit similar voltage distributions and selectively performing calibration operations for limited subsets of memory cells based on their block family association. Further, because such tracking, storage, and calibration are performed on a block family basis as opposed to a per-block (or per-page) basis, processing, memory, and storage resources are preserved for host system usage. Other advantages will be apparent to those skilled in the art of memory allocation and error optimization within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager 113 that can be used to implement the block family-based error avoidance strategies in accordance with embodiments of the present disclosure. In some embodiments, the controller 115 includes at least a portion of the block family manager 113. For example, the controller 115 can include a processor 117 (processing device) configured to execute instructions stored in local memory 119 for performing the operations described herein. In some embodiments, the block family manager 113 is part of the host system 120, an application, or an operating system. The block family manager 113 can manage block families associated with the memory devices 130, as described in more detail herein below.

Figure 2:
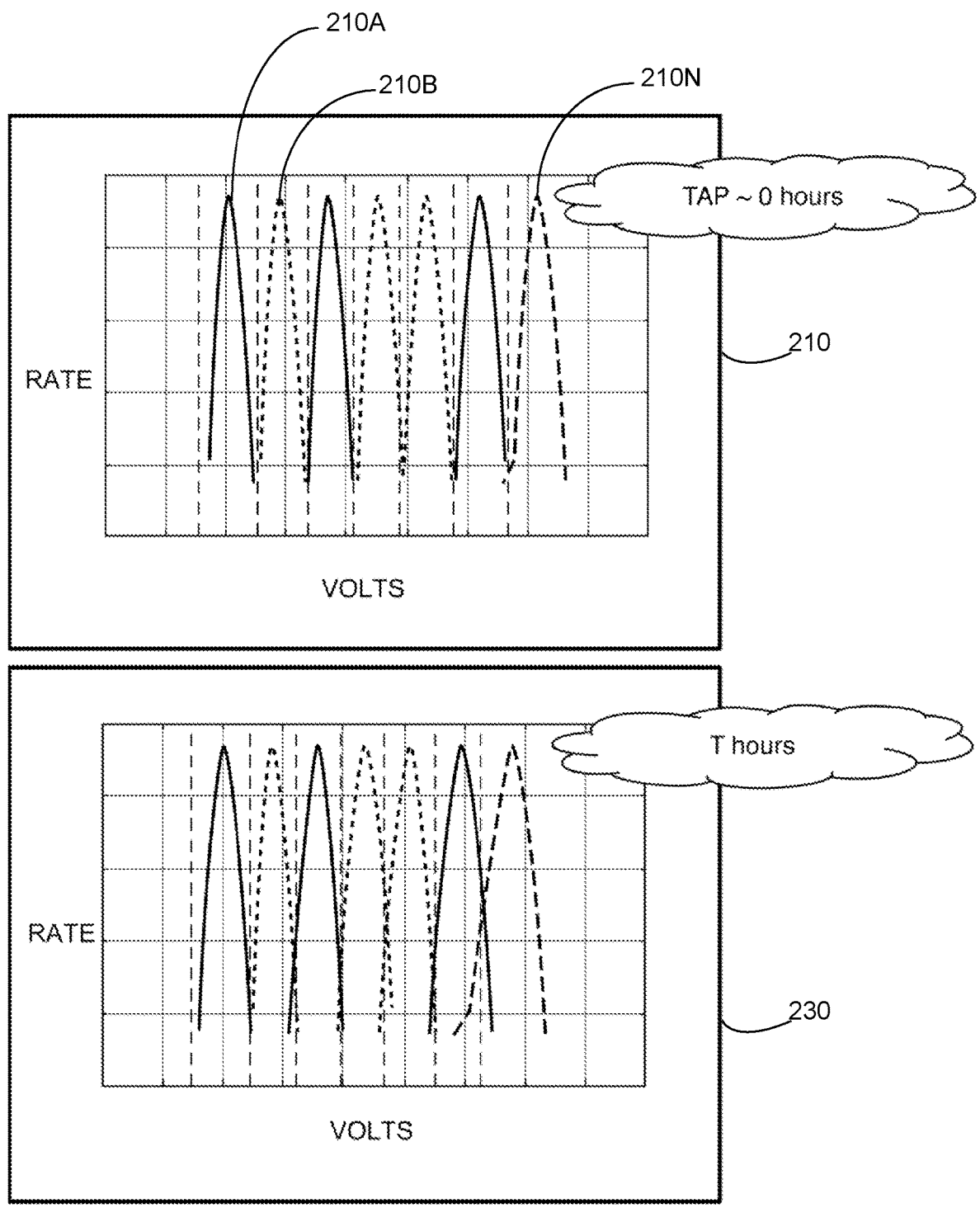
FIG. 2 is a set of graphs that illustrate a temporal voltage shift caused by the slow charge loss exhibited by triple-level memory cells, in accordance with some embodiments.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph illustrates a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions change in time due to the slow charge loss, which results in drifting values of the threshold voltage levels (shown by dashed vertical lines). In various embodiments, this temporal voltage shift (TVS) is selectively tracked for programmed pages or blocks grouped by block families, and appropriate voltage offsets, which are based on page or block affiliation with a certain block family, are applied to the base read levels in order to perform read operations.

Figure 3:
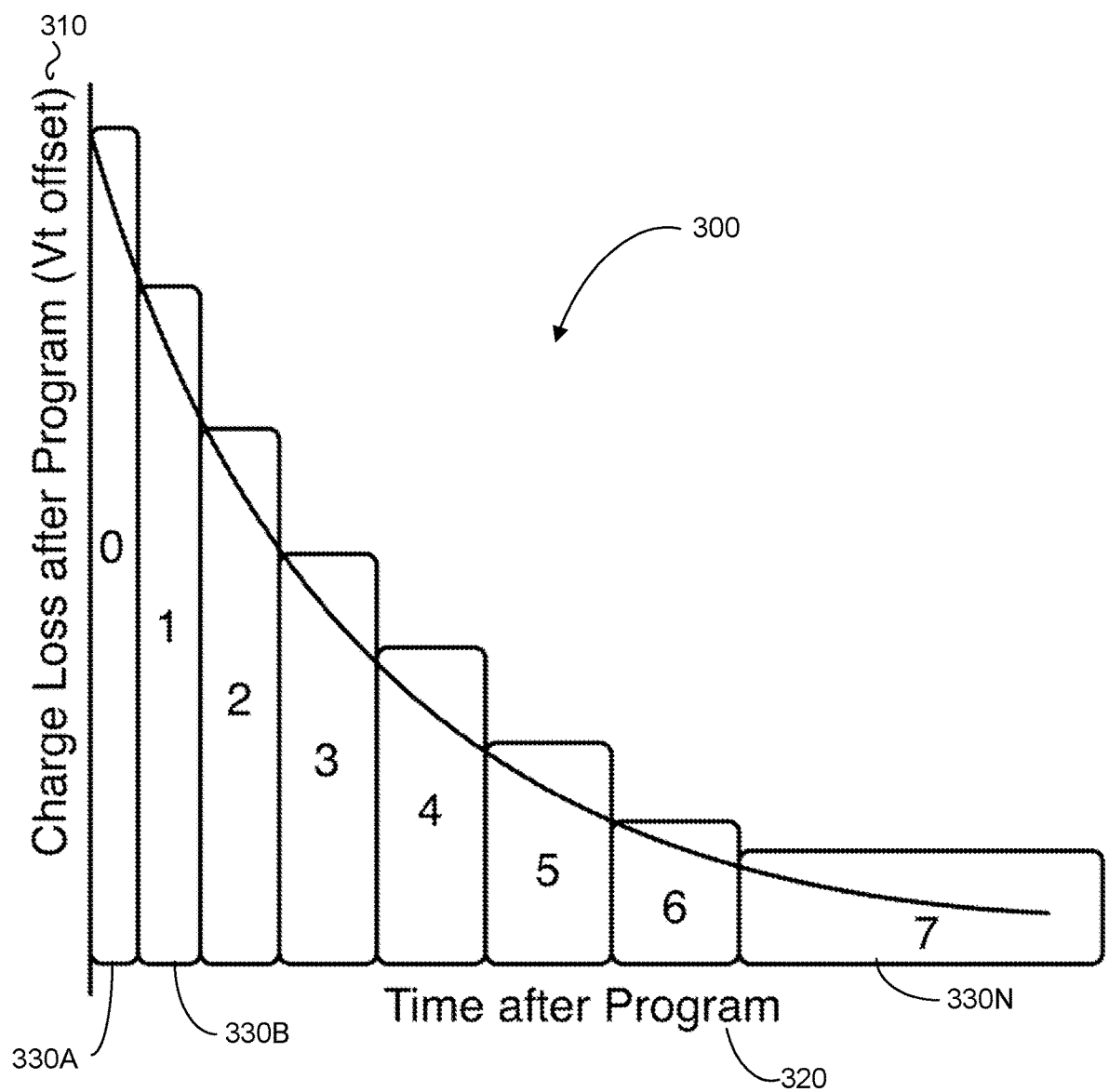
FIG. 3 is an example graph illustrating the dependency of a threshold voltage offset on the time after program, e.g., the period of time elapsed since a page had been programmed, in accordance with some embodiments.
Figure 4:
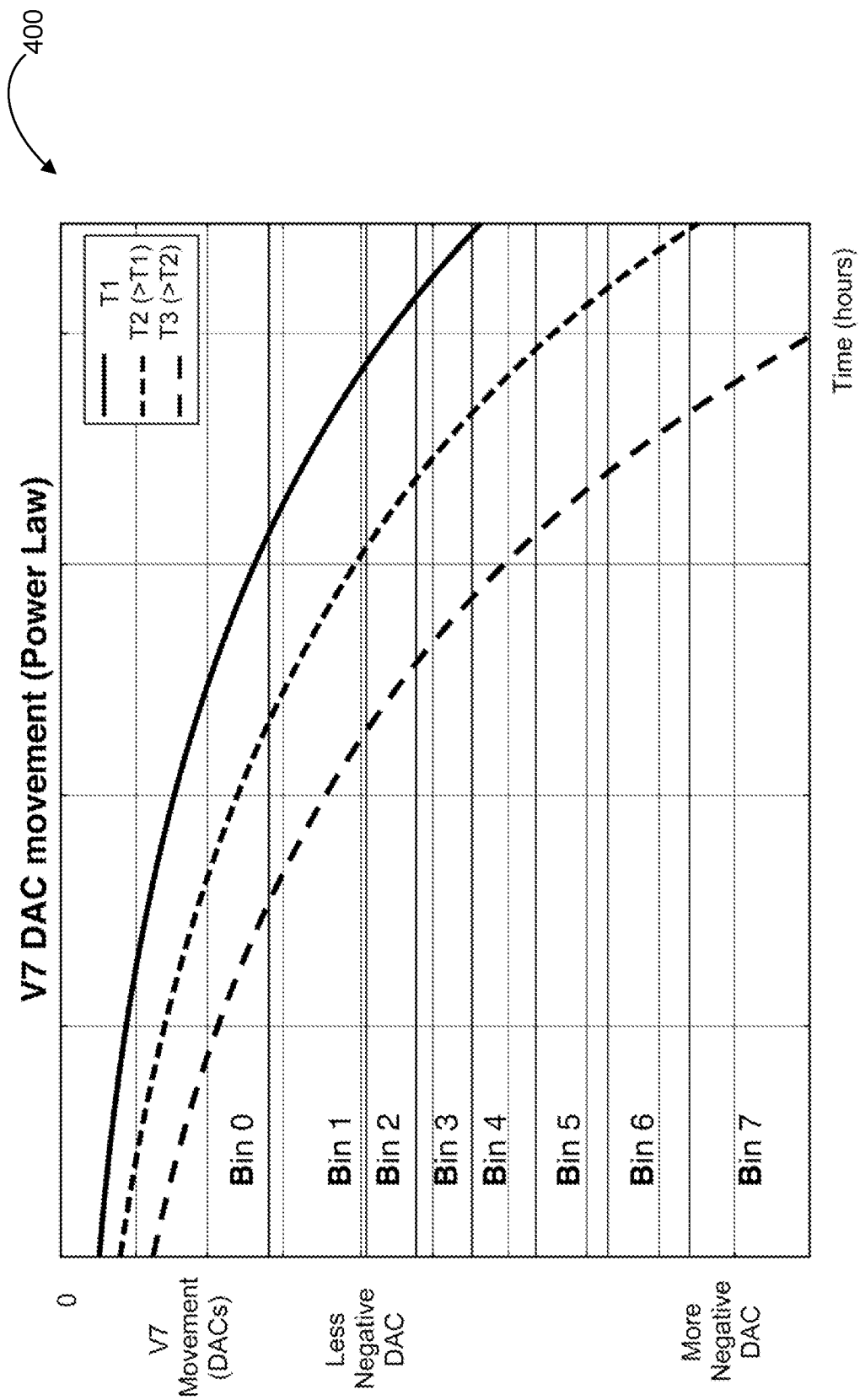
FIG. 4 is an example graph illustrating the dependency of the threshold voltage offset on both time after program and average temperature, in accordance with some embodiments.

FIG. 3 is an example graph 300 illustrating the dependency of a threshold voltage offset 310 on the time after program 320, e.g., the period of time elapsed since a page had been programmed, in accordance with some embodiments. FIG. 4 is an example graph 400 illustrating the dependency of the threshold voltage offset on both time after program (TAP) and average temperature, in accordance with some embodiments. As schematically illustrated by FIG. 3, pages or blocks (or groups of memory cells at another granularity) of the memory device are grouped into block families 330A-330N, such that each block family includes one or more pages or blocks that have been programmed within a specified time window, potentially varied by average temperature while the block family is open (FIG. 4). As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an average temperature associated with pages during programming. More specifically, the entire asymptotic curve illustrated in FIG. 3 can be shifted to have a steeper curve with respect to time, as illustrated in FIG. 4, as average temperature increases. In FIG. 4, the curve associated with 20° C. decreases with time at a much slower rate (e.g., about 100 times slower) compared to the curve associated with 88° C. For example, the former exits Bin 7 in excess of 100,000 hours TAP while the latter exits Bin 7 at about 1,000 hours TAP. The curves in FIG. 4 look differently from the curve in FIG. 3 due to being graphed at log 10 scale in order to illustrate the difference in slow charge loss as temperature varies. Slow charge loss is illustrated along the vertical access for the seventh valley (V7) based on digital-to-analog (DAC) converted voltage values, also referred to as DACs. Each DAC can represent a certain number of millivolts (mV), here about 10 mV.

A newly created block family can be associated with bin 0, and each subsequently created block family can be associated with a sequentially numbered block family. Then, the memory sub-system controller can periodically perform a calibration process in order to associate each die of every block family with one of the predefines threshold voltage offset bins (e.g., bins 0-7 in the illustrative example of FIG. 3), which is in turn associated with the voltage offset to be applied for read operations. The associations of pages, blocks, and/or partitions with block families and block families and dies with threshold voltage offset bins can be stored in respective metadata tables maintained by the memory sub-system controller 115.

Figure 5:
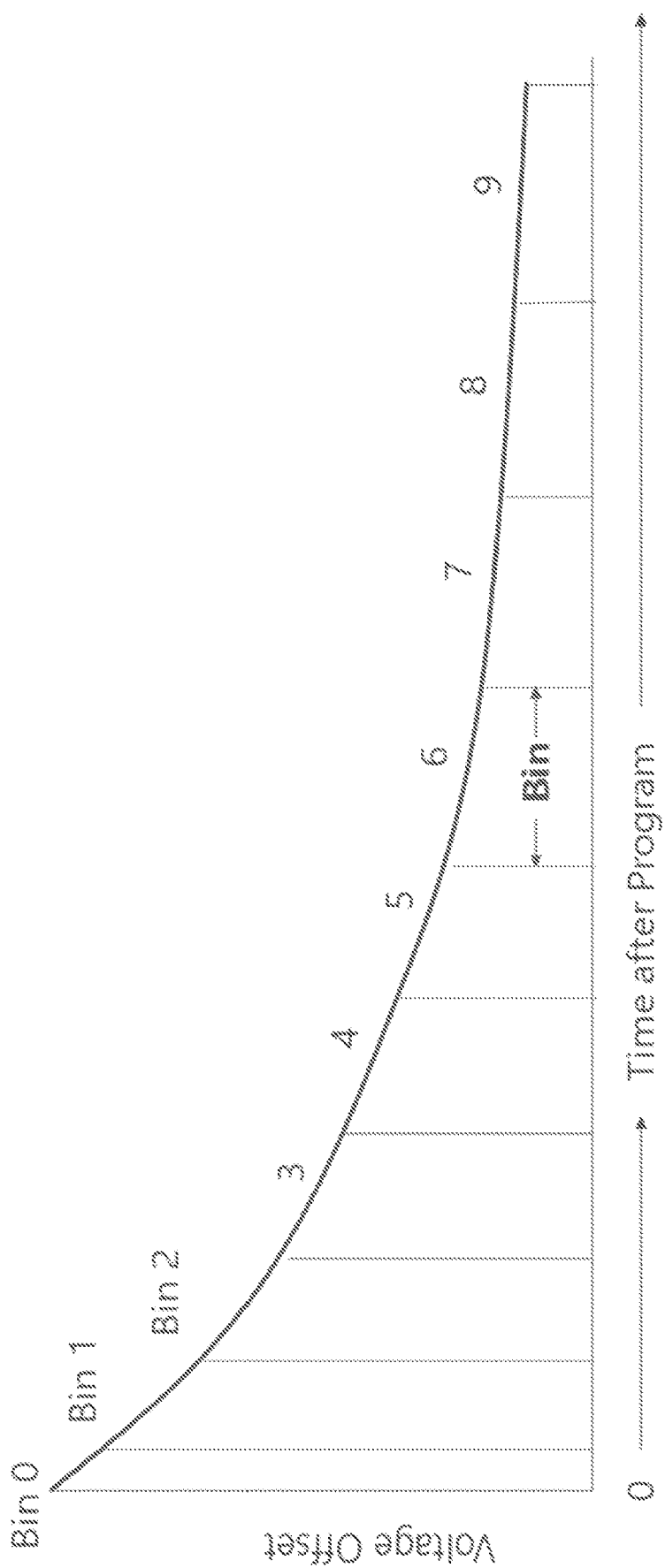
FIG. 5 is a graph that illustrates a set of predefined threshold voltage offset bins, in accordance with embodiments.

FIG. 5 is a graph that illustrates a set of predefined threshold voltage offset bins (bin 0 to bin 9), in accordance with some embodiments. As schematically illustrated by FIG. 5, the threshold voltage offset graph can be subdivided into multiple threshold voltage offset bins, such that each bin corresponds to a predetermined range of threshold voltage offsets. While the illustrative example of FIG. 5 defines ten bins, in other implementations, various other numbers of bins can be employed (e.g., 16, 32, 64 bins). Based on a periodically performed calibration process, the memory sub-system controller 115 can associate each die of every block family with a threshold voltage offset bin, which defines a set of threshold voltage offsets to be applied to the base voltage read level in order to perform read operations.

Figure 6:
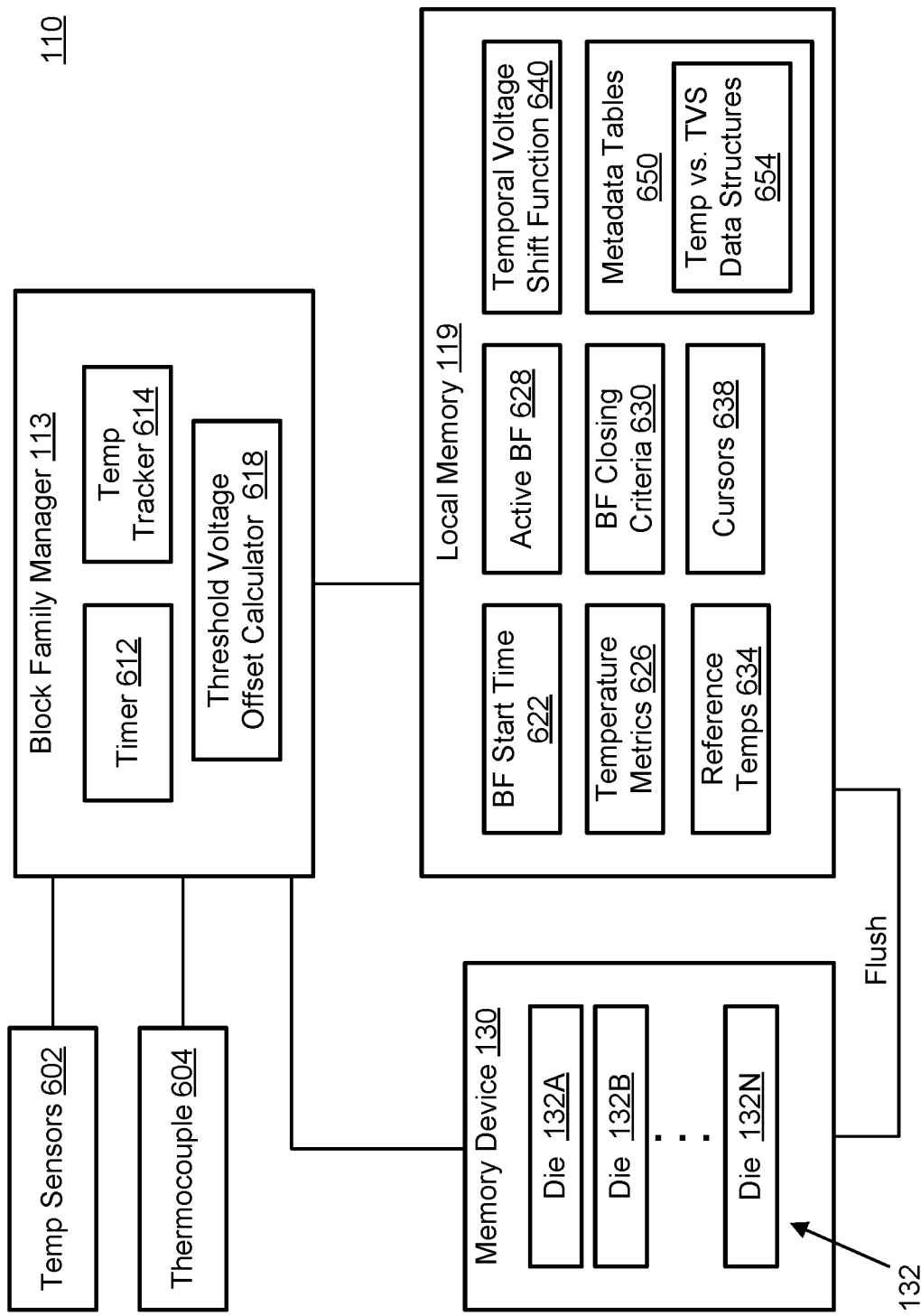
FIG. 6 is a block diagram that illustrates operation of a block family manager within the memory sub-system controller of FIG. 1 in accordance with various embodiments.

FIG. 6 is a block diagram that illustrates operation of the block family manager 113 within the memory sub-system controller 115 of FIG. 1 in accordance with various embodiments. In various embodiment, the memory sub-system can include temperature sensors 602 and a thermocouple 604. The thermocouple 604 can be coupled over at least a portion of the memory device 130 to help cool the memory device 130. The memory device 130 can include multiple dice 132, including a first die 132A, a second die 132B, . . . to include an Nth die 132N. The temperature sensors 602 can include, but not be limited to, a temperature sensor coupled to the controller 115, a temperature sensor coupled to the thermocouple 604, a temperature sensor located elsewhere within the memory sub-system 110, a temperature sensor at one die, of multiple dice of the memory device 130, and/or temperature sensors distributed across each of the multiple dice 132 of the memory device 130.

In this way, the block family manager 113 can determine a temperature for or associated with a block family within the memory device 130 in different ways. For example, the block family manager 113 can use a temperature measured of the thermocouple 604, of the controller 115, of another location within the memory sub-system 110, to include the temperature of one die or of the multiple dice 132 of the memory device 130. In some embodiments, the inter-temperature difference between the multiple dice 132 is small, e.g., within a few degrees; in other embodiments, the temperature difference is large, e.g., within tens of degrees. Further, if a temperature is measured at one or more of the multiple dice 132, the reference temperature for the memory device 130 can be determined at the die with the maximum temperature across the multiple dice 132.

The block family manager 113 can include a timer 612, a temperature tracker 614, and a threshold voltage offset calculator 618, although other functionality of the block family manager 113 will be discussed with reference to managing and tracking block families throughout this disclosure. In one embodiment, the timer 612 is located elsewhere in the controller 115, such as within the processor 117. The local memory 119 can store a number of different items of information or data that will be discussed in more detail, including but not limited to, a block family (BF) start time 622, temperature metrics 626, an active block family (BF) identifier 628, BF closing criteria 630, reference temperatures 634, cursors 638 associated with the memory device 130, a temporal shift function 640, and a set of metadata tables 650. At least one of the metadata tables 650 includes at least one temperature versus TVS data structure 654. This information and data can be flushed to the memory device 130 (or other non-volatile memory) in response to detection of an imminent loss of power.

More specifically, in various embodiments, the block family manager 113 can open a new block family after a previously block family has been closed. At initiation of each block family, the block family manger 113 can initialize the timer 612 associated with a system clock. The system clock, for example, can be a clock maintained by the memory sub-system 110 and/or the host system 120. The time at which the block family is opened on the system clock can be stored as the BF start time 622. The block family manager 113 can further, using one or more of the temperature sensor(s) 602, measure an opening temperature of the memory device 130. This opening temperature can be stored in the local memory 119, such as with values of the temperature metrics 626.

As time passes while the controller 115 programs the BF of the memory device 130, the block family manager 113 (e.g., the temperature tracker 614) can continuously calculate values for one or more of the temperature metrics 626 based on temperature values measured by the temperature sensor(s) 602. In this way, the values for the temperature metrics 626 are tracked and a history of the temperature metrics can also be stored in the reference temperatures 634 of the local memory 119. The block family manager 113 can then compare the temperature metric values against specified threshold temperature values that function as the BF closing criteria 630 for closing the block family. For example, in response to the block family manager 113 determining that a temperature metric value is greater than or equal to a specified threshold temperature value, the block family manger 113 can close the block family. These various metrics and values will be discussed in more detail.

The block family currently being programmed can be referred to as the active block family for which the active BF identifier 628 can be stored in the local memory 119 and indexed to within the metadata tables 650. For ease of tracking, each subsequently programmed block family can be assigned a sequentially numbered BF identifier, but other sequences and identifiers can also be used. The blocks families can also be associated with one or more of the cursors 638, e.g., at least an opening cursor and a closing cursor for each BF. "Cursor" herein shall broadly refer to a location on the memory device to which the data is being written.

In various embodiments, the temperature metrics 626 can include an absolute temperature difference between the maximum (or highest) temperature and a minimum (or lowest) temperature associated with the block family before the block family is closed. The temperature metrics 626 can further include a value derived from integrating, over time, the absolute temperature difference between the opening temperature and an immediate temperature of the memory device 130. This temperature integration can yield an average absolute temperature difference up to the point the immediate temperature is measured.

The temperature metrics 626 can further include values that represent the average of any of other temperature metrics across multiple measurements, e.g., different temperature sensors 602, including those positioned at the multiple dice 132 of the memory device 130. In one embodiment, the block family manager 113 can determine an aggregated temperature metric value over the multiple dice 132 of the memory device. In response to determining that a first temperature metric value for the first die 132A (or other die), of the multiple dice 132, is greater than or equal to a maximum threshold temperature value, the block family manager 113 can exclude the first temperature metric value from the aggregated temperature metric value. The aggregated temperature metric value can then be compared against the specified threshold temperature value used as criteria for closing the block family. In this way, an outlier higher temperature value at a die that is above some predefined maximum temperature is excluded and the remaining total temperature metric value is more representative of the overall temperature of multiple dice 132 as a whole.

In various embodiments, the block family manager 113 can set or adjust the BF closing criteria 630, which can vary depending on application or design. The BF closing criteria 630 can include, but not be limited to, a single threshold temperature value (e.g., 30° C., 40° C., or the like). The BF closing criteria 630 can further be a threshold temperature function that varies with a reference temperature for the block family. For an example of the latter, if the block family was programmed at a high temperature, the threshold temperature value set for closing the block family can also be set higher. Thus, the block family manager can determine the specified threshold temperature value by evaluating a function of an absolute temperature value for a particular reference temperature associate with the block family. Further, varying the specified threshold temperature in this way also operates to expand or compress the integration of the absolute temperature difference as the function of absolute temperature.

A reference temperature as referred to herein is a temperature that is representative of the block family, and can be determined at different times while the block family is opened, when the block family is closed, as well as after the block family has been closed. If a temperature value is measured for each page when the page is programmed, the reference temperature can be an average of the measured temperature values for the block family, which can be referred to as a reference program temperature. The reference temperature can also be recorded as the opening temperature for the block family when the block family is opened. This opening reference temperature value can also be measured at a variety of the temperature sensors 602 as was discussed previously. A further reference temperature can be continuously updated throughout the time the block family is open, e.g., based on measured temperature values while additional pages are being programmed. Thus, an updated reference temperature value can be calculated during programming the block family. A closing reference temperature can be designated for this further reference temperature value as the block family is closed or close to being closed.

In various embodiments, a temporal voltage shift (TVS) value (or other data state metric) can be measured in one more memory cell of the block family. A data state metric can be a quantity that is measured or inferred from the behavior of data within the memory cells of the block family that provides insight in the voltage state of the data. Thus, the data state metric can indicate the state of TVS, a $5^{th}$ valley location, a $7^{th}$ distribution median voltage, a degree of read disturb, the number of error bits measured using a particular read level, or the like value. The block family manager 113 can compare the measured TVS value with the TVS function 640 stored in the local memory 119 to determine a time after program (TAP) for the block family. The TVS function is a function that describes how the TVS value measurement (or other data state metric) varies as a function of time after program. Thus, reference to the TVS value along with change in temperature can, with reference to the TVS function, further inform how much time the block family manager 113 waits until closing the block family.

Furthermore, the threshold voltage offset calculator 618 can access the metadata tables 650 to determine which threshold voltage offset bin should be used for a particular read. As discussed with reference to FIGS. 3-4, as the TVS value for a BF shifts with increasing slow charge loss, the BF will be read with reference to bins with larger voltage offset values. These larger voltage offset values can come from higher-numbered bins, for example.

In one embodiment, after the block family is closed, the block family manager 113 can record a temperature value based on one or more reference temperature for the block family. The block family manager can also read data from any page of the block family via application of a threshold voltage offset, from a threshold voltage offset bin associated with the temperature value, to a base read level voltage. In this way, the temperature value directs which threshold voltage offset bin is used because of the significant impact that temperature has on slow large loss.

In another embodiment, the block family manager 113 employs one of the temperature versus TVS data structure 654 in order to determine which threshold voltage offset bin to use to perform a given read operation. For example, the block family manager 113 can use a matrix of threshold voltage offset bins that is indexed by both temperature and TVS value, which will be discussed in more detail with reference to FIG. 9. As the temperature increases, for example, the threshold voltage offset bins can increase in number. Similarly, as the TVS value increases, the threshold voltage offset bins can also increase in number. Table 1 illustrates an example of the matrix for purposes of explanation, but can vary in many respects depending on the opening temperature, number of program erase cycles, and other factors. Further, the rows and columns can be swapped as would be evident to those skilled in the art.

TABLE 1

| Temp/TVS | TVS_0 | TVS_1 | TVS_2 | TVS_3 | TVS_4 | TVS_5 |
|---|---|---|---|---|---|---|
| Temp_0 | 0 | 0 | 1 | 1 | 1 | 2 |
| Temp_1 | 0 | 1 | 1 | 1 | 2 | 2 |
| Temp_2 | 1 | 1 | 1 | 2 | 2 | 2 |
| Temp_3 | 1 | 1 | 2 | 2 | 2 | 3 |
| Temp_4 | 1 | 2 | 2 | 2 | 3 | 3 |
| Temp_5 | 2 | 2 | 2 | 3 | 3 | 3 |

In an alternative embodiment, the block family manager 113 retrieves threshold voltage offset bin values from a temperature bin offset vector (using the measured reference temperature value) and from a TVS bin offset vector (using the measured TVS value). Summing these threshold voltage offset bin values results in a threshold voltage offset bin, which is specified by one or more threshold offset voltages. This approach will be discussed as an alternative embodiment of FIG. 9. Table 2 illustrates an example of a temperature offset vector and Table 3 illustrates an example of a TVS bin offset vector, both which may be referenced in this alternative embodiment. Additional or different bin offsets are envisioned but are not included for purposes of brevity.

TABLE 2

| Temp (° C.) | 0-20 | 21-50 | 51-80 | 81-104 | 105-129 | 130-145 |
|---|---|---|---|---|---|---|
| Bin Offsets | Offset_0 | Offset_01 | Offset_02 | Offset_03 | Offset_04 | Offset_05 |

TABLE 3

| TVS (DAC) | 0-14 | 14.1-20 | 20.1-24 | 24.1-27 | 27.1-32 | 32.1-36 |
|---|---|---|---|---|---|---|
| Bin Offsets | Offset_0 | Offset_01 | Offset_02 | Offset_03 | Offset_04 | Offset_05 |

Regardless of the temperature versus TVS data structure 654 referenced, the block family manager can then read data from any page of the block family via application of a threshold voltage offset, specified by the threshold voltage offset bin, to a base read level voltage.

In some embodiments, the block family manager 113 can further combine block families that are close to each other in TVS value, in temperature change, or both. This combination can be performed after sufficient time and/or temperature change has occurred within two different block families that tend to merge in terms of the effects of temperature voltage offset for purposes of referencing the same threshold offset bins. If average absolute temperature difference is used as criteria for combining two block families, a difference between the average absolute temperature difference values for the two block families can be determined to be below a threshold temperature difference before performing the combining of the two block families.

Figure 7:
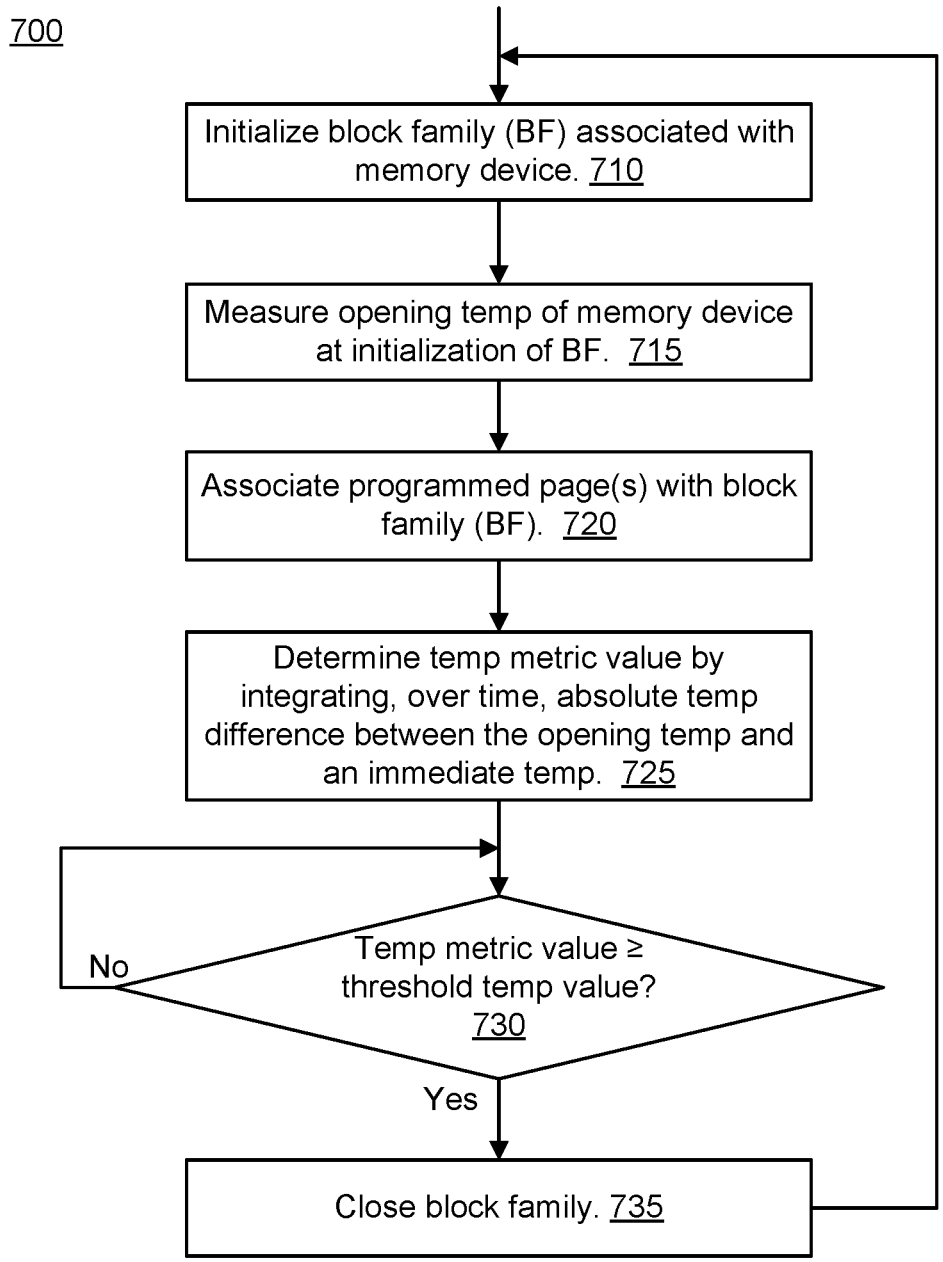
FIG. 7 is a flow diagram of an example method for determining, by a memory sub-system controller, open block family duration based on temperature variation, in accordance with some embodiments.

FIG. 7 is a flow diagram of an example method 700 for determining, by a memory sub-system controller, open block family duration based on temperature variation, in accordance with some embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 710, the processing logic initializes a block family associated with a memory device, such as the memory device 130 in FIG. 6. The processing logic can record a BF identifier and corresponding one or more cursor that defines the beginning of the block family within the memory device.

At operation 715, the processing logic measures an opening temperature of the memory device at initialization of the block family. The opening temperature may be taken from any or a combination of the temperature sensors 602 discussed with relation to FIG. 6.

At operating 720, responsive to programming a page residing on the memory device, the processing logic associates the page with the block family. Thus, this association can be a partition of one block if less than an entire block is written before the block family is closed. Similarly, multiple blocks can be associated with the block family before it is closed.

At operation 725, the processing logic determines a temperature metric value by integrating, over time, an absolute temperature difference between the opening temperature and an immediate temperature of the memory device. This temperature integration can yield an average absolute temperature difference up to the point the immediate temperature is measured.

At operation 730, the processing logic determines whether the temperature metric value is greater than or equal to a specified threshold temperature value. As discussed, the specified threshold temperature value can be a fixed threshold temperature value or a value derived from a threshold temperature function that varies with a reference temperature for the block family.

At operation 735, in response to the temperature metric value being greater than or equal to a specified threshold temperature value, the processing logic closes the block family. The processing logic may also record a cursor associated with the memory device when the block family is closed and the temperature metric value at the time of closure with which to compare later on when determining from which threshold voltage offset bin to retrieve a threshold voltage offset to be applied in reading from the block family.

Figure 8:
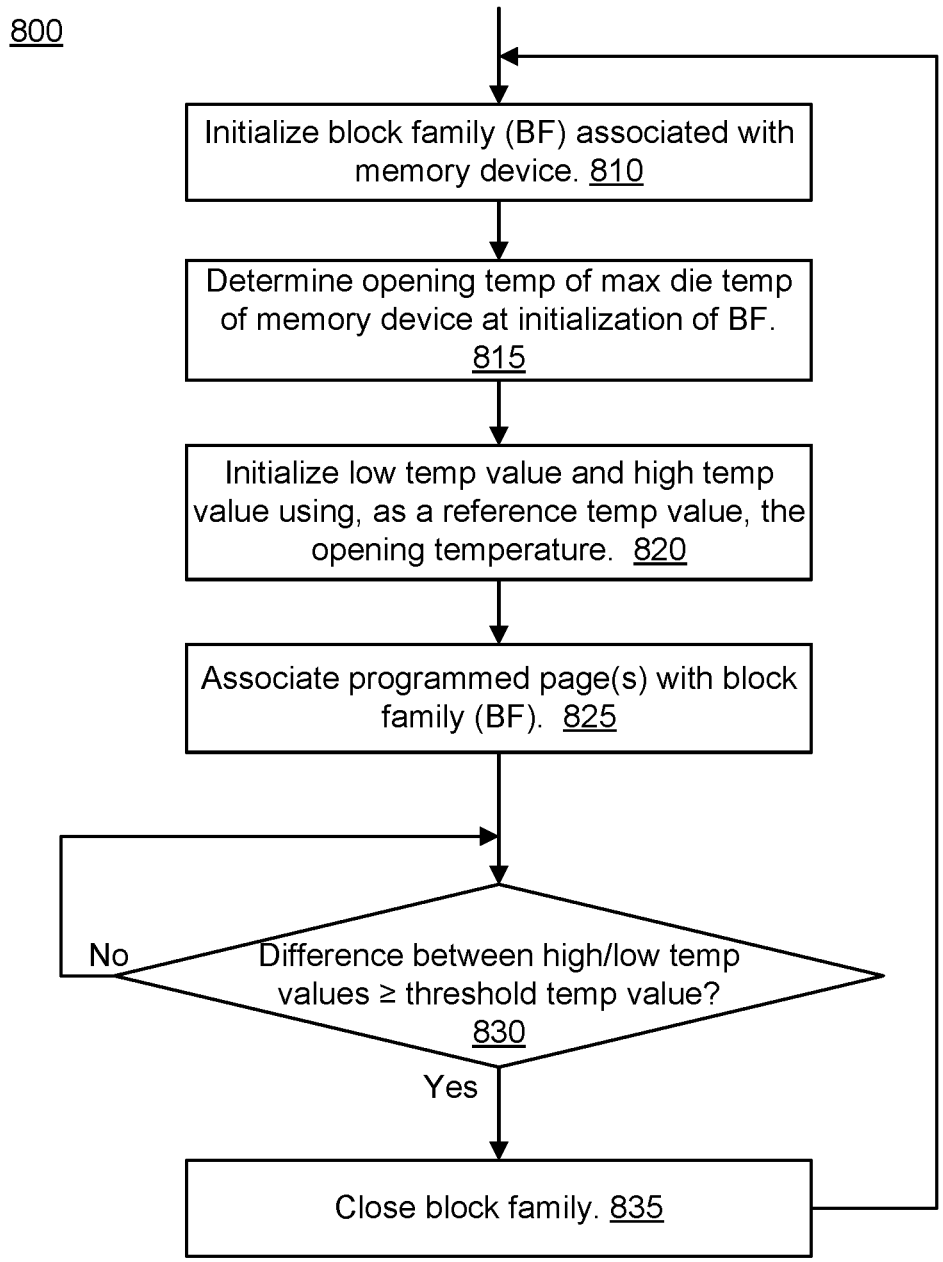
FIG. 8 is a flow diagram of an example method of determining, by a memory sub-system controller, open block family duration based on temperature range, in accordance with some embodiments.

FIG. 8 is a flow diagram of an example method 800 of determining, by a memory sub-system controller, open block family duration based on temperature range, in accordance with some embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 810, the processing logic initializes a block family associated with a memory device, such as the memory device 130 in FIG. 6. The memory device can include multiple dice that are programmable. The processing logic can record a BF identifier and corresponding one or more cursor that defines the beginning of the block family within the memory device.

At operation 815, the processing logic determines an opening temperature at a die of the multiple dice. The opening temperature can be computed as a maximum temperature across the multiple dice at initialization of the block family. For example, the die having a temperature sensor reading that is the highest across the multiple dice will be taken as the opening temperature.

At operation 820, the processing logic initializes a low temperature value and a high temperature value using, as a reference temperature value, the opening temperature. The low temperature value and the high temperature value can be stored in memory and continuously updated while the block family is open.

At operation 825, responsive to programming a page residing on the memory device, the processing logic associates the page with the block family. Thus, this association can be a partition of one block if less than an entire block is written before the block family is closed. Similarly, multiple blocks can be associated with the block family before it is closed.

At operation 830, the processing logic determines whether the difference between the high temperature value and the low temperature value is greater than or equal to a specified threshold temperature value. As discussed, the specified threshold temperature value can be a fixed threshold temperature value or a value derived from a threshold temperature function that varies with a reference temperature for the block family.

At operation 835, in response to determining that the difference between the high temperature value and the low temperature value is greater than or equal to a specified threshold temperature value, the processing logic closes the block family. The processing logic may also record a cursor associated with the memory device when the block family is closed and the temperature metric value at the time of closure with which to compare later on when determining from which threshold voltage offset bin to retrieve a threshold voltage offset to be applied in reading from the block family.

Further, as an extension to the method 800, the processing logic, at operation 815, can instead measure multiple temperature values, each temperature value of which is measured at a respective die of the multiple dice. At operation 820, the processing logic can initialize, for the multiple dice, the low temperature value and the high temperature value using, as a reference temperature value, an average of the temperature values measured at the multiple dice. The processing logic can further update, over time, the high temperature value and the low temperature value based on periodic temperature values measured at the multiple dice. The processing logic can further determine an average of the difference between the high temperature value and the low temperature value for the multiple dice. At operation 835, in response to the average of the difference being greater than or equal to the specified threshold temperature value, the processing logic can close the block family. In this way, the method 800 is applied to the multiple dice as a group in one embodiment.

Figure 9:
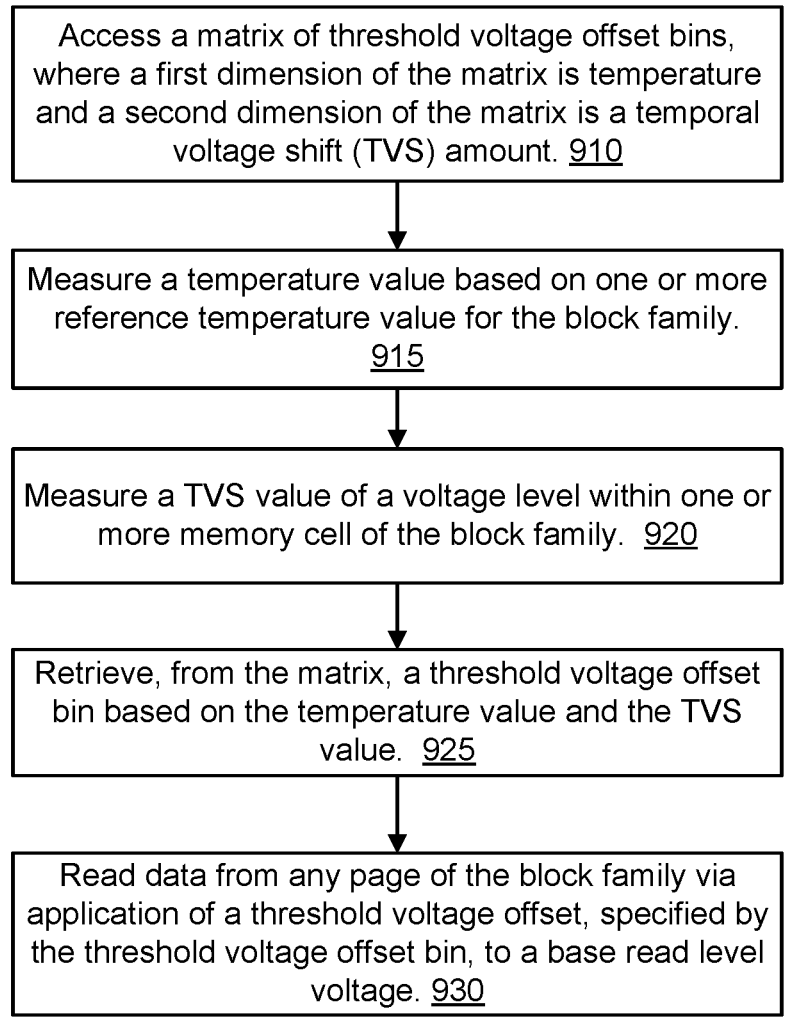
FIG. 9 is a flow diagram of an example method of using temperature versus temporal voltage shift (TVS) to determine a threshold voltage offset with which to perform a read operation, in accordance with an embodiment.

FIG. 9 is a flow diagram of an example method 900 of using temperature versus temporal voltage shift (TVS) to determine a threshold voltage offset with which to perform a read operation, in accordance with an embodiment. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic accesses a matrix of threshold voltage offset bins, where a first dimension of the matrix is temperature and a second dimension of the matrix is a temporal voltage shift (TVS) amount. As the temperature increases, for example, the threshold voltage offset bins increase in number.

At operation 915, the processing logic measures a temperature value based on one or more reference temperature for the block family. As discussed, the reference temperature can be measured at a single die or can be averaged across multiple dice at which the block family is programmed.

At operation 920, the processing logic measures a TVS value of a voltage level within one or more memory cell of the block family. This measurement can also be taken at a single die or can be averaged across multiple dice at which the family block is programmed.

At operation 925, the processing logic retrieves, from the matrix, a threshold voltage offset bin based on the temperature value and the TVS value. With reference to Table 1, for example, a TVS value of TVS_2 cross referenced against a reference temperature value of Temp_3 yields threshold offset bin 2, or a TVS value of TVS_5 cross referenced against a reference temperature value of Temp_4 yields threshold offset bin 3.

At operation 930, the processing logic reads data from any page of the block family via application of a threshold voltage offset, specified by the threshold voltage offset bin, to a base read level voltage. Thus, the threshold voltage offset may be added to the base read level voltage to determine a modified read level voltage, which is used to reach the page(s) of the block family.

At an alternative embodiment to method 900, instead of retrieving the threshold voltage offset bin from the matrix (e.g., Table 1), the processing logic can calculate the threshold voltage offset bin as follows. The processing logic retrieves, from the temperature bin offset vector (e.g., Table 2), a first threshold voltage offset bin value based on the temperature value. For example, if the temperature value is between 51 and 80° C., the first threshold voltage offset bin value would be Offset_2. The processing logic also retrieves, from the TVS bin offset vector (e.g., Table 3), a second threshold voltage offset bin value based on the TVS value. For example, if the TVS value were between 24.1 and 27 DAC, than the second threshold voltage offset bin value would be Offset_3. The processing logic can then determine the threshold voltage offset bin by summing the first threshold voltage offset bin value and the second threshold voltage offset bin value. For example, the processing logic sums Offset_2 and Offset_3 together to yield, e.g., Offset_5. A threshold voltage offset value assigned to the threshold voltage offset bin value of Offset_5 is applied to the base read level voltage in reading from the block family.

Figure 10:
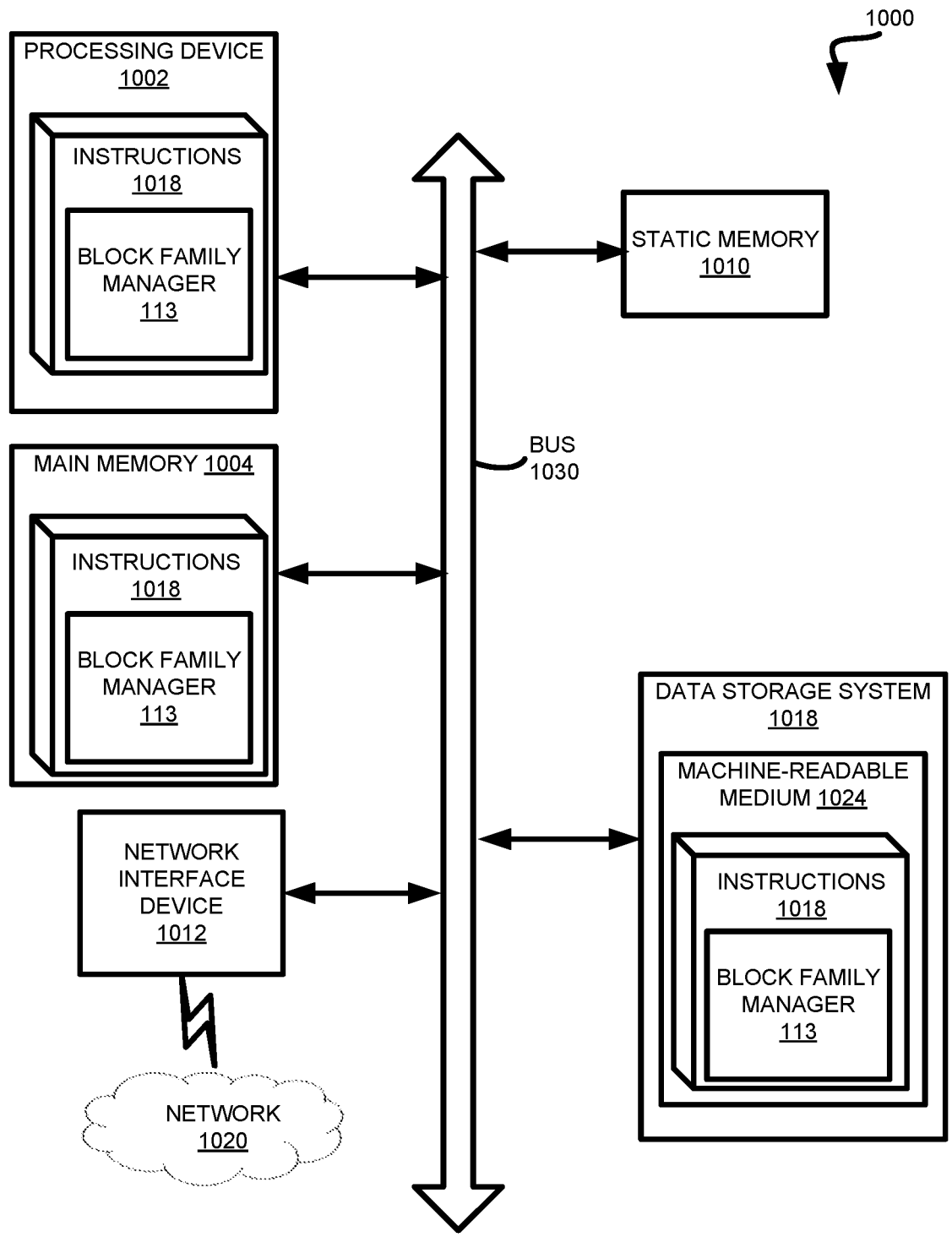
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1010 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1028 for performing the operations and steps discussed herein. The computer system 1000 can further include a network interface device 1012 to communicate over the network 1020.

The data storage system 1018 can include a machine-readable storage medium 1024 (also known as a computer-readable medium) on which is stored one or more sets of instructions 1028 or software embodying any one or more of the methodologies or functions described herein. The instructions 1028 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1028 include instructions to implement functionality corresponding to the block family manager 113 of FIG. 1. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, the processing device to perform operations, comprising:
accessing a matrix of threshold voltage offset bins, where a first dimension of the matrix is temperature and a second dimension of the matrix is a temporal voltage shift (TVS) amount;
measuring a temperature value based on a reference temperature value for a block family of the memory device;
measuring a TVS value of a voltage level within one or more memory cells of the block family;
retrieving, from the matrix, a threshold voltage offset bin based on the reference temperature value and the TVS value; and
reading data from any page of the block family via application of a threshold voltage offset, specified by the threshold voltage offset bin, to a base read level voltage.

2. The system of claim 1, wherein the operations further comprise recording a temperature value based on the reference temperature value for the block family.

3. The system of claim 1, wherein the operations further comprise:
initializing the block family associated with the memory device; and
responsive to programming a page residing on the memory device, associating the page with the block family.

4. The system of claim 3, wherein the reference temperature value associated with the block family comprises at least one of:
a temperature value measured for memory cells programmed while the block family is open; or
an average of measured temperature values for the block family while the block family is open.

5. The system of claim 3, wherein the operations further comprise:
measuring an opening temperature of the memory device at initialization of the block family;
determining a temperature metric value by integrating, over time, an absolute temperature difference between the opening temperature and an immediate temperature of the memory device; and
closing the block family in response to the temperature metric value being greater than or equal to a specified threshold temperature value that is based on a threshold temperature function of an absolute temperature value, wherein the absolute temperature function varies with a reference temperature value associated with the block family.

6. The system of claim 5, further comprising a plurality of temperature sensors, wherein each temperature sensor of the plurality of temperature sensors is coupled to a respective die of a plurality of dice of the memory device, wherein at least one of the temperature sensors is to measure the opening temperature and the immediate temperature.

7. The system of claim 6, wherein the temperature metric value is associated with a single die of the memory device, and wherein the operations further comprise:
determining an average of the temperature metric value for the plurality of dice; and
wherein closing the block family is performed in response to the average of the temperature metric value being greater than or equal to the specified threshold temperature value.

8. The system of claim 6, wherein the temperature metric value is associated with a single die of the memory device, and wherein the operations further comprise:
determining an aggregated temperature metric value over the plurality of dice;

in response to determining that a first temperature metric value for a first die of the plurality of dice is greater than or equal to a maximum threshold temperature value, excluding the first temperature metric value from the aggregated temperature metric value; and wherein closing the block family is in response to the aggregated temperature metric value being greater than or equal to the specified threshold temperature value.

9. A method comprising:

measuring, by a processing device, a temperature value based on a reference temperature value for a block family of a memory device;

retrieving, from a temperature bin offset vector, a first threshold voltage offset bin value based on the temperature value;

measuring a temporal voltage shift (TVS) value of a voltage level within one or more memory cells of the block family;

retrieving, from a TVS bin offset vector, a second threshold voltage offset bin value based on the TVS value;

determining a threshold voltage offset bin by summing the first threshold voltage offset bin value and the second threshold voltage offset bin value; and reading, by the processing device, data from a page of the block family via application of a threshold voltage offset, specified by the threshold voltage offset bin, to a base read level voltage.

10. The method of claim 9, further comprising recording a temperature value based on the reference temperature value for the block family.

11. The method of claim 9, further comprising:

initializing the block family associated with the memory device; and responsive to programming a page residing on the memory device, associating the page with the block family.

12. The method of claim 11, wherein the reference temperature value associated with the block family comprises at least one of:

a temperature value measured for memory cells programmed while the block family is open; or an average of measured temperature values for the block family while the block family is open.

13. The method of claim 11, further comprising:

measuring an opening temperature of the memory device at initialization of the block family;

determining a temperature metric value by integrating, over time, an absolute temperature difference between the opening temperature and an immediate temperature of the memory device; and closing the block family in response to the temperature metric value being greater than or equal to a specified threshold temperature value that is based on a threshold temperature function of an absolute temperature value, wherein the absolute temperature function varies with reference temperature value associated with the block family.

14. The method of claim 13, wherein measuring the opening temperature comprises measuring a temperature of one of a thermocouple or a controller that is coupled to the memory device.

15. The method of claim 13, wherein the temperature metric value is associated with a single die of the memory device, the method further comprising:

determining an average of the temperature metric value for a plurality of dice of the memory device; and wherein closing the block family is performed in response to the average of the temperature metric value being greater than or equal to the specified threshold temperature value.

16. The method of claim 13, wherein the temperature metric value is associated with a single die of the memory device, the method further comprising:

determining an aggregated temperature metric value over a plurality of dice of the memory device;

in response to determining that a first temperature metric value for a first die of the plurality of dice is greater than or equal to a maximum threshold temperature value, excluding the first temperature metric value from the aggregated temperature metric value; and wherein closing the block family is in response to the aggregated temperature metric value being greater than or equal to the specified threshold temperature value.

17. A method comprising:

accessing a matrix of threshold voltage offset bins for a memory device, where a first dimension of the matrix is temperature and a second dimension of the matrix is a temporal voltage shift (TVS) amount;

measuring a temperature value based on a reference temperature value for a block family of the memory device;

measuring a TVS value of a voltage level within one or more memory cells of the block family;

retrieving, from the matrix, a threshold voltage offset bin based on the reference temperature value and the TVS value; and reading, using a processing device of the memory device, data from any page of the block family via application of a threshold voltage offset, specified by the threshold voltage offset bin, to a base read level voltage.

18. The method of claim 17, further comprising:

initializing the block family associated with the memory device;

responsive to programming a page residing on the memory device, associating the page with the block family; and recording a temperature value based on the reference temperature value for the block family.

19. The method of claim 18, wherein the reference temperature value associated with the block family comprises at least one of:

a temperature value measured for memory cells programmed while the block family is open; or an average of measured temperature values for the block family while the block family is open.

20. The method of claim 18, further comprising:

measuring an opening temperature of the memory device at initialization of the block family;

determining a temperature metric value by integrating, over time, an absolute temperature difference between the opening temperature and an immediate temperature of the memory device; and closing the block family in response to the temperature metric value being greater than or equal to a specified threshold temperature value that is based on a threshold temperature function of an absolute temperature value, wherein the absolute temperature function varies with a reference temperature value associated with the block family.

* * * * *